US009065626B2

(12) United States Patent
Barner

(10) Patent No.: US 9,065,626 B2
(45) Date of Patent: Jun. 23, 2015

(54) BIT ERROR RATE IMPACT REDUCTION

(75) Inventor: Craig Barner, Shrewsbury, MA (US)

(73) Assignee: Cavium, Inc., San Jose, CA (US)

( * ) Notice: Subject to any disclaimer, the term of this patent is extended or adjusted under 35 U.S.C. 154(b) by 324 days.

(21) Appl. No.: 13/281,059

(22) Filed: Oct. 25, 2011

(65) Prior Publication Data

US 2013/0104012 A1   Apr. 25, 2013

(51) Int. Cl.
*G06F 11/10* (2006.01)
*H04L 1/00* (2006.01)
*H03M 13/09* (2006.01)

(52) U.S. Cl.
CPC ............. *H04L 1/0066* (2013.01); *H03M 13/09* (2013.01); *H04L 1/007* (2013.01); *H04L 1/0072* (2013.01)

(58) Field of Classification Search
CPC ... G06F 11/104; G06F 11/10; G06F 11/1004; G06F 11/1044; H04L 1/0061; H04L 1/007; H04L 1/0062; H04L 1/0072; H03M 3/091; H03M 13/09; H05K 999/99; G11B 20/1833
See application file for complete search history.

(56) References Cited

U.S. PATENT DOCUMENTS

| 4,754,457 | A | 6/1988 | Bright et al. |
| 5,099,497 | A | 3/1992 | Ohno et al. |
| 5,299,236 | A | 3/1994 | Pandula |
| 6,026,350 | A | 2/2000 | Tustin et al. |
| 6,055,619 | A | 4/2000 | North et al. |
| 6,232,895 | B1 | 5/2001 | Djupsjöbacka et al. |
| 7,046,174 | B1 | 5/2006 | Lui et al. |
| 7,782,805 | B1 * | 8/2010 | Belhadj et al. ............... 370/300 |
| 8,254,291 | B2 | 8/2012 | Ahn et al. |
| 8,270,433 | B2 | 9/2012 | Jiang |
| 8,332,729 | B2 | 12/2012 | Sivaramakrishnan et al. |
| 8,340,005 | B1 | 12/2012 | Belhadj et al. |
| 8,718,069 | B2 | 5/2014 | Hashimoto |
| 2003/0190922 | A1 | 10/2003 | Dalvi et al. |
| 2005/0036618 | A1 | 2/2005 | Gammel et al. |
| 2006/0192700 | A1 | 8/2006 | Hori |
| 2009/0024883 | A1 * | 1/2009 | Bethard ..................... 714/708 |
| 2009/0224801 | A1 | 9/2009 | Lewin |
| 2009/0313526 | A1 | 12/2009 | Neuman |

(Continued)

OTHER PUBLICATIONS

"Interlaken Protocol Definition—A Joint Specification of Cortina Systems and Cisco Systems," Revision 1.2, Cortina Systems Inc. and Cisco Systems, Inc., 2006-2008, pp. 1-52, Oct. 7, 2008.

(Continued)

*Primary Examiner* — Albert Decady
*Assistant Examiner* — Enamul M Kabir
(74) *Attorney, Agent, or Firm* — Hamilton, Brook, Smith & Reynolds, P.C.

(57) ABSTRACT

In an embodiment, a method includes receiving at a data interface a data stream having a plurality of logical communication channels. The data stream includes in succession a first data burst corresponding to one of the plurality of logical communication channels, a burst control word and a second data burst corresponding to the one or an other of the plurality of logical communication channels. The burst control word includes a first error check that protects the first data burst and the burst control word and a second error check that protects only the burst control word. The first error check and the second error check are examined. Only the one logical communication channel is errored out if the first error check is bad and the second error check is good; all open logical communication channels are errored out if the first error check is bad and the second error check is bad.

6 Claims, 8 Drawing Sheets

(56) References Cited

U.S. PATENT DOCUMENTS

2010/0260298 A1  10/2010  Zinser
2011/0219208 A1  9/2011  Asaad et al.
2011/0296282 A1  12/2011  Liu et al.
2013/0019084 A1  1/2013  Orchard et al.
2013/0101069 A1  4/2013  Barner
2013/0101076 A1  4/2013  Barner
2013/0104012 A1  4/2013  Barner

OTHER PUBLICATIONS

Press Release, "Cavium Networks Unveils OCTEON II CN68XX—Industry's Highest-Performance Multi-Core Processors for Energy-Efficient Data Center, Mobile Internet and the Borderless Enterprise," 3 pgs., May 11, 2010.

* cited by examiner

BIT ERROR RATE IMPACT REDUCTION

BACKGROUND

SerDes (serializer/deserializer) devices allow the transmission of data over a single differential pair instead of a parallel bus. A SerDes transmitter takes a parallel set of data bits (i.e., a data word) and converts it to a serial stream of bits for transmission over a single differential pair. The SerDes receiver reconstructs the data word from the received serial bit stream.

SUMMARY

The probability of an error in the data portion of a data burst is significantly higher than the probability of error in a burst control word that may be used. In the approach of the present invention, the burst control word is augmented to include an additional error detection function to protect the burst control word itself. With this inventive approach, the impact of bit errors in the incoming data stream can be reduced.

In one aspect, a method includes receiving at a data interface a data stream having a plurality of logical communication channels. The data stream includes in succession a first data burst corresponding to one of the plurality of logical communication channels, a burst control word and a second data burst corresponding to the one or an other of the plurality of logical communication channels. The burst control word includes a first error check that protects the first data burst and the burst control word and a second error check that protects only the burst control word. The first error check and the second error check are examined. Only the one logical communication channel is errored out if the first error check is bad and the second error check is good; all open logical communication channels are errored out if the first error check is bad and the second error check is bad.

In another aspect, a receiver includes a data interface and an error detection circuit. The data interface is configured to receive a data stream having a plurality of logical communication channels, the data stream including in succession a first data burst corresponding to one of the plurality of logical communication channels, a burst control word and a second data burst corresponding to the one or an other of the plurality of logical communication channels, the burst control word including a first error check that protects the first data burst and the burst control word and a second error check that protects only the burst control word. The error detection circuit is configured to examine the first error check and the second error check; error out only the one logical communication channel if the first error check is bad and the second error check is good; and error out all open logical communication channels if the first error check is bad and the second error check is bad.

In an embodiment, the first error check is CRC24 and the second error check is CRC8.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Before describing example embodiments of the present invention in detail, an example network security processor in which the embodiments may be implemented is described immediately below to help the reader understand the inventive features of the present invention.

Figure 1:
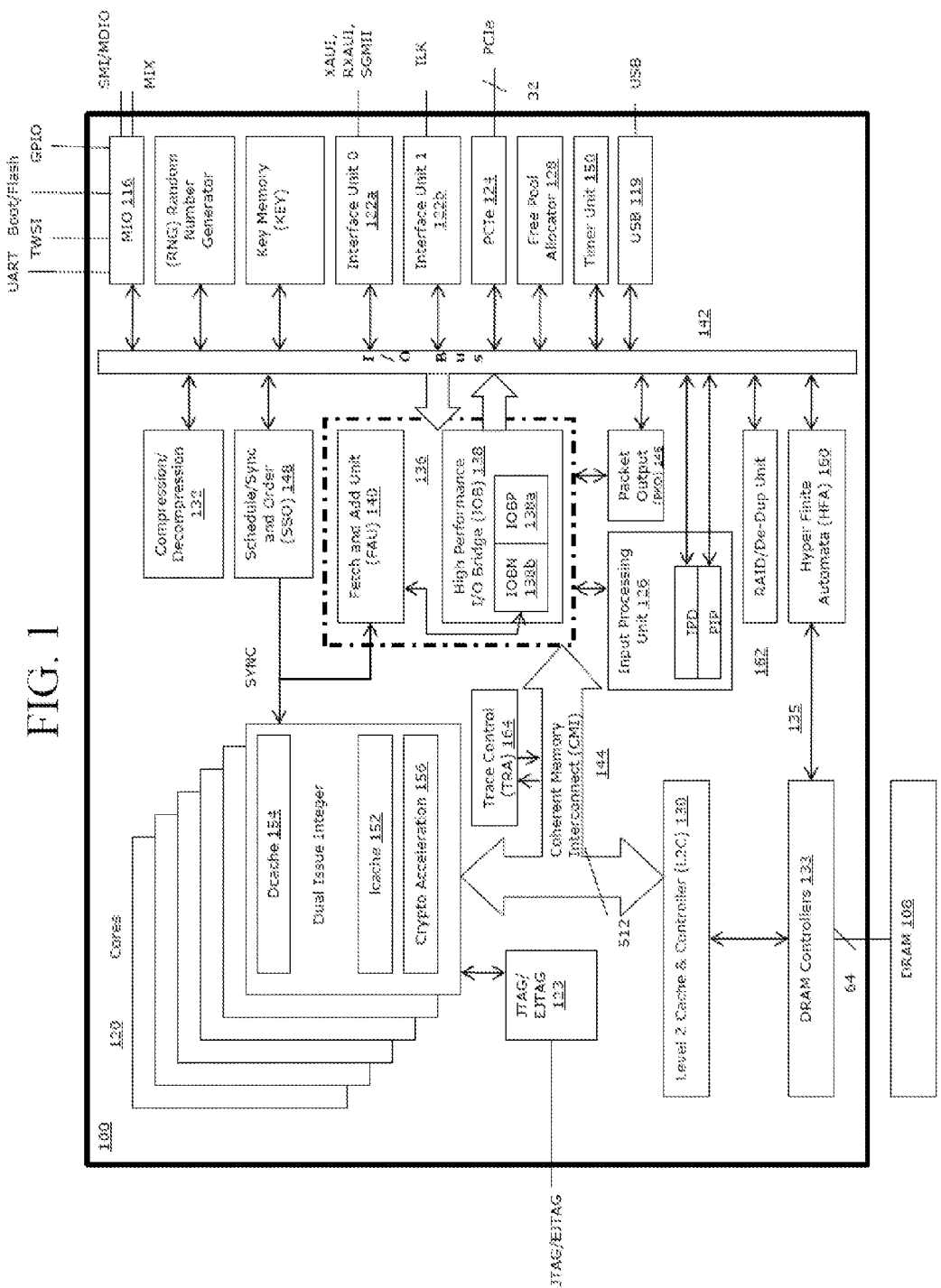
FIG. 1 is a block diagram of an example network services processor.

FIG. 1 is a block diagram illustrating a network services processor 100. The network services processor 100 delivers high application performance using at least one processor core 120.

The network services processor 100 processes Open System Interconnection network L2-L7 layer protocols encapsulated in received packets. As is well-known to those skilled in the art, the Open System Interconnection (OSI) reference model defines seven network protocol layers (L1-L7). The physical layer (L1) represents the actual interface, electrical and physical that connects a device to a transmission medium. The data link layer (L2) performs data framing. The network layer (L3) formats the data into packets. The transport layer (L4) handles end to end transport. The session layer (L5) manages communications between devices, for example, whether communication is half-duplex or full-duplex. The presentation layer (L6) manages data formatting and presentation, for example, syntax, control codes, special graphics and character sets. The application layer (L7) permits communication between users, for example, file transfer and electronic mail.

The network services processor 100 may schedule and queue work (packet processing operations) for upper level network protocols, for example L4-L7, and allow processing of upper level network protocols in received packets to be performed to forward packets at wire-speed. Wire-speed is the rate of data transfer of the network over which data is transmitted and received. By processing the protocols to forward the packets at wire-speed, the network services processor does not slow down the network data transfer rate.

A packet is received for processing by a plurality of interface units 122. A packet can also be received by a PCIe interface 124. The interface unit 122 performs pre-processing of the received packet by checking various fields in the L2 network protocol header included in the received packet and then forwards the packet to a packet input processing unit 126. At least one interface unit 122a can receive packets from a plurality of X Attachment Unit Interfaces (XAUI), Reduced X Attachment Unit Interfaces (RXAUI) or Serial Gigabit Media Independent Interfaces (SGMII). At least one interface unit 122b can receive connections from an Interlaken Interface (ILK).

The packet input processing unit 126 (also referred to as packet input processing and input packet data unit or PIP/IPD) performs further pre-processing of network protocol headers (e.g., L3 and L4 headers) included in the received packet. The pre-processing includes checksum checks for TCP/User Datagram Protocol (UDP) (L3 network protocols).

A free-pool allocator 128 maintains pools of pointers to free memory in Level-2 cache memory 130 and external DRAM 108. The packet input processing unit 126 uses one of the pools of pointers to store received packet data in Level-2 cache memory 130 or external DRAM 108 and another of the pools of pointers to allocate work queue entries for the processor cores 120.

The packet input processing unit 126 then writes packet data into buffers in Level-2 cache 130 or external DRAM 108. Preferably, the packet data is written into the buffers in a format convenient to higher-layer software executed in at least one of the processor cores 120. Thus, further processing of higher level network protocols is facilitated.

The network services processor 100 can also include one or more application specific co-processors. These co-processors, when included, offload some of the processing from the cores 120, thereby enabling the network services processor to achieve high-throughput packet processing. For example, a compression/decompression co-processor 132 is provided that is dedicated to performing compression and decompression of received packets. Other embodiments of co-processing units include the RAID/De-Dup Unit 162, which accelerates data striping and data duplication processing for disk-storage applications.

Another co-processor is a Hyper Finite Automata (HFA) unit 160 which includes dedicated HFA thread engines adapted to accelerate pattern and/or signature matching necessary for anti-virus, intrusion-detection systems and other content-processing applications. Using a HFA unit 160, pattern and/or signature matching is accelerated, for example being performed at rates upwards of multiples of tens of gigabits per second. The HFA unit 160, in some embodiments, could include any of a Deterministic Finite Automata (DFA), Non-deterministic Finite Automata (NFA) or HFA algorithm unit.

An I/O interface 136 manages the overall protocol and arbitration and provides coherent I/O partitioning. The I/O interface 136 includes an I/O bridge 138 and a fetch-and-add unit 140. The I/O Bridge includes two bridges, an I/O Packet Bridge (IOBP) 138*a* and an I/O Bus Bridge (IOBN) 138*b*. The I/O Packet Bridge 138*a* is configured to manage the overall protocol and arbitration and provide coherent I/O portioning with primarily packet input and output. The I/O Bus Bridge 138*b* is configured to manage the overall protocol and arbitration and provide coherent I/O portioning with primarily the I/O Bus. Registers in the fetch-and-add unit 140 are used to maintain lengths of the output queues that are used for forwarding processed packets through a packet output unit 146. The I/O bridge 138 includes buffer queues for storing information to be transferred between a coherent memory interconnect (CMI) 144, an I/O bus 142, the packet input processing unit 126 and the packet output unit 146.

The miscellaneous I/O interface (MIO) 116 can include auxiliary interfaces such as General Purpose I/O (GPIO), Flash, IEEE 802 two-wire Management Data I/O Interface (MDIO), Serial Management Interface (SMI), Universal Asynchronous Receiver-Transmitters (UARTs), Reduced Gigabit Media Independent Interface (RGMII), Media Independent Interface (MII), two wire serial interface (TWSI) and other serial interfaces.

The network services provider 100 may also include a Joint Test Action Group ("JTAG") Interface 123 supporting the MIPS EJTAG standard. According to the JTAG and MIPS EJTAG standards, a plurality of cores within the network services provider 100 will each have an internal Test Access Port ("TAP") controller. This allows multi-core debug support of the network services provider 100.

A Schedule/Sync and Order (SSO) module 148 queues and schedules work for the processor cores 120. Work is queued by adding a work queue entry to a queue. For example, a work queue entry is added by the packet input processing unit 126 for each packet arrival. A timer unit 150 is used to schedule work for the processor cores 120.

Processor cores 120 request work from the SSO module 148. The SSO module 148 selects (i.e., schedules) work for one of the processor cores 120 and returns a pointer to the work queue entry describing the work to the processor core 120.

The processor core 120, in turn, includes instruction cache 152, Level-1 data cache 154 and crypto-acceleration 156. In one embodiment, the network services processor 100 includes 32 superscalar Reduced Instruction Set Computer (RISC)-type processor cores 120. In some embodiments, each of the superscalar RISC-type processor cores 120 includes an extension of the MIPS64 version 3 processor core. In one embodiment, each of the superscalar RISC-type processor cores 120 includes a cnMIPS II processor core.

Level-2 cache memory 130 and external DRAM 108 are shared by all of the processor cores 120 and I/O co-processor devices. Each processor core 120 is coupled to the Level-2 cache memory 130 by the CMI 144. The CMI 144 is a communication channel for all memory and I/O transactions between the processor cores 120, the I/O interface 136 and the Level-2 cache memory 130 and controller. In one embodiment, the CMI 144 is scalable to 32 processor cores 120, supporting fully-coherent Level 1 data caches 154 with write through. Preferably the CMI 144 is highly-buffered with the ability to prioritize I/O. The CMI is coupled to a trace control unit 164 configured capture bus request so software can later read the request and generate a trace of the sequence of events on the CMI.

The Level-2 cache memory controller 130 maintains memory reference coherence. It returns the latest copy of a block for every fill request, whether the block is stored in Level-2 cache memory 130, in external DRAM 108 or is "in-flight." It also stores a duplicate copy of the tags for the data cache 154 in each processor core 120. It compares the addresses of cache-block-store requests against the data-cache tags, and invalidates (both copies) a data-cache tag for a processor core 120 whenever a store instruction is from another processor core or from an I/O component via the I/O interface 136.

In some embodiments, a plurality of DRAM controllers 133 supports up to 128 gigabytes of DRAM. In one embodiment, the plurality of DRAM controllers includes four DRAM controllers, each of the DRAM controllers supporting 32 gigabytes of DRAM. Preferably, each DRAM controller 133 supports a 64-bit interface to DRAM 108. Additionally, the DRAM controller 133 can supports preferred protocols, such as the DDR-III protocol.

After a packet has been processed by the processor cores 120, the packet output unit 146 reads the packet data from the Level-2 cache memory 130, DRAM 108, performs L4 network protocol post-processing (e.g., generates a TCP/UDP checksum), forwards the packet through the interface units 122 or the PCIe interface 124 and frees the L2 cache memory 130/DRAM 108 used by the packet.

The DRAM Controllers 133 manages in-flight transactions (loads/stores) to/from the DRAM 108. In some embodiments, the DRAM Controllers 133 include four DRAM controllers, the DRAM 108 includes four DRAM memories, and each DRAM controller is connected to a DRAM memory. The DFA unit 160 is coupled directly to the DRAM Controllers 133 on a bypass-cache access path 135. The bypass-cache access path 135 allows the HFA Unit to read directly from the memory without using the Level-2 cache memory 130, which can improve efficiency for HFA operations.

Figure 2:
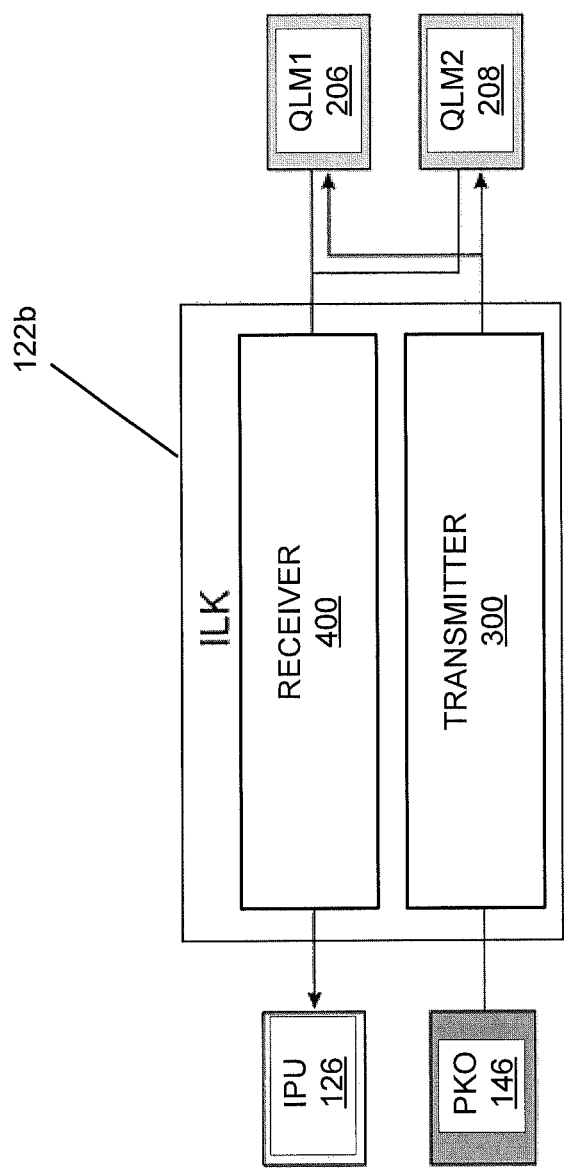
FIG. 2 illustrates an example interface unit in the processor of FIG. 1.

FIG. 2 illustrates an example interface unit 122 of processor 100. In the description of embodiments that follows, the interface unit is described in the context of the Interlaken protocol and referred to as ILK interface unit 122b.

In the embodiments described herein, the ILK interface unit 122b provides a narrow, high-speed, channelized packet interface conforming to the Interlaken Protocol Definition V1.2 and the Interlaken Look-Aside Protocol Definition V1.1.

In the Interlaken Protocol, two fundamental structures are defined: data transmission format and the metaframe. According to the data transmission format, packet data is segmented into one or more bursts. Each burst is bounded by two control words, one before and one after. Fields within the control words affect either the data burst following or preceding them for functions that include start-of-packet, end-of-packet, channelization and error detection. Each burst is associated with a logical channel. The segmenting of the data into bursts allows for the interleaving of data transmissions from different logical channels.

The metaframe is defined to include a set of four unique control words to provide lane alignment, scrambler initialization, clock compensation and diagnostic functions. The metaframe runs in-band with the data transmissions, using the control words to distinguish it from the data.

The PCIe, ILK, XAUI/RXAUI and SGMII interfaces 122, 124 (FIG. 1) may be embodied as shared SerDes interfaces. In an embodiment, the SerDes interface is made up of five quad-lane modules (QLMs) that each supports up to four serial lanes. The ILK interface unit 122b includes a receiver 400 and transmitter 300 that connect with QLM1 206 and QLM2 208. The receiver 400 receives an incoming data stream from QLM1, QLM2, processes the incoming data stream and passes the processed input data to packet input processing unit 126. The transmitter 300 receives outgoing data from packet output unit (PKO) 146, processes the outgoing data and passes the processed outgoing data to QLM1, QLM2.

Figure 3:
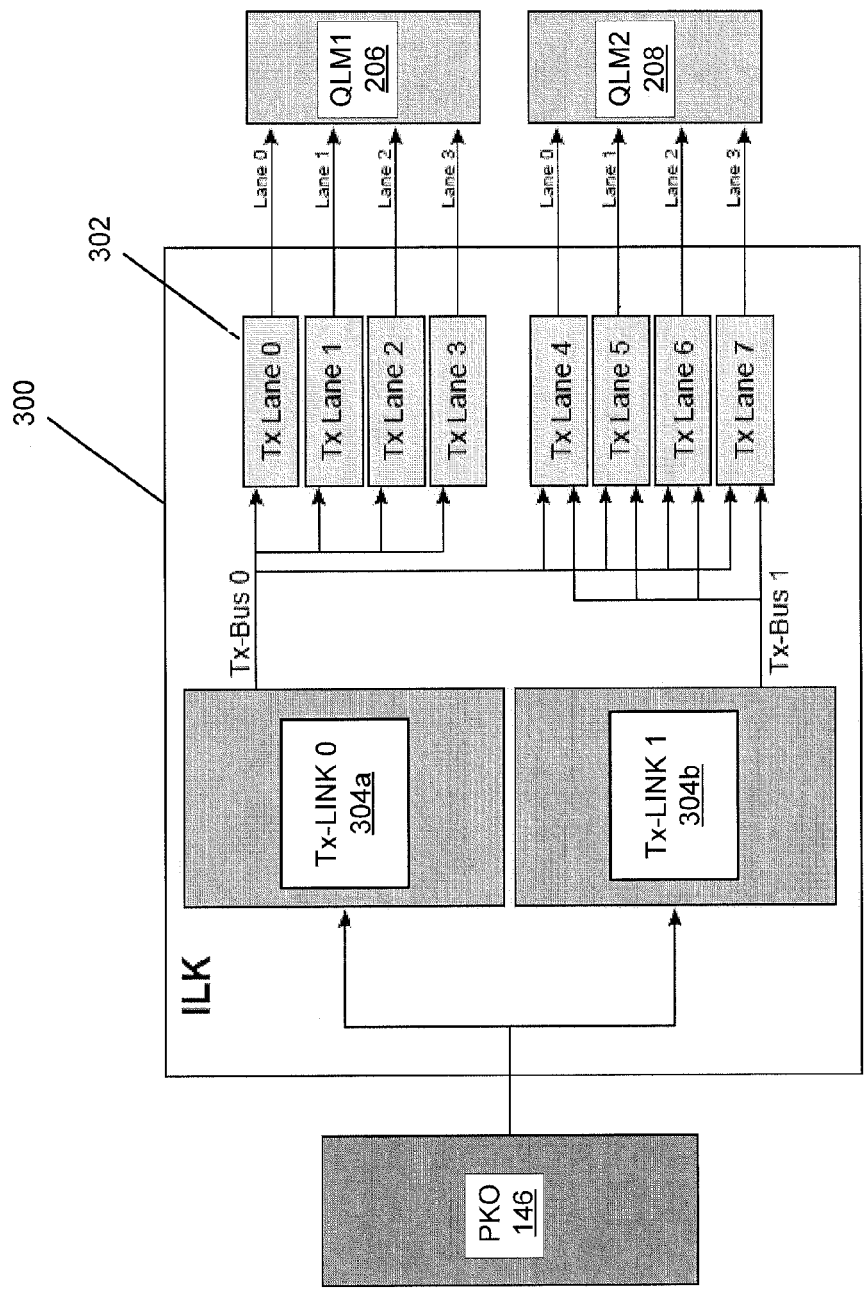
FIG. 3 illustrates an example transmitter in the interface unit of FIG. 2.

FIG. 3 is a block diagram of an example transmitter 300 in the interface unit of FIG. 2. The transmitter includes two main subunits: per-link logic (Tx-link) 304 and per-lane logic (Tx-lane) 302. In the example embodiment, there are two Tx-links and eight Tx-lanes. The ILK interface unit can bundle a single Tx-link (Tx-link0 only) to eight Tx-lanes (1×8) or the two Tx-links can split the lanes as necessary for a particular configuration (e.g. 2×4 or 1×4 and 1×2, etc.). The Tx-link is configured to implement a majority of the Interlaken protocol-layer definition, which includes burst control, flow control, CRC24 checks and striping.

The first stage of the Tx-link 304 is a transmit FIFO that stores transmit data received from PKO. The second stage unloads the transmit FIFO and inserts the burst/idle control words. Once the selected lanes are enabled, a burst/idle control function begins generating idle control words. This continues until certain conditions are met, and a new burst is started by inserting a burst-control word. Next, the appropriate number of 64-bit data words are unloaded from the transmit FIFO. Lastly, the burst needs to be closed. If the conditions to begin another burst are met, the current burst is closed with a burst-control word. Otherwise, the current burst is closed with an idle-control word and the burst/control function resumes generating idle-control words until the conditions to begin a burst are once again satisfied.

The third stage of the Tx-link performs the CRC24 calculation and updates the CRC24 of the burst/control words. In the final stage of the Tx-link, framing-control is implemented to stripe the stream of Interlaken control/data words across the enabled lanes. In addition, the framing-control function inserts the synchronization, scrambler state and diagnostic words.

The Tx-lane 302 receives 66 bits of data and a valid bit from the Tx-link 304. There are eight Tx-lanes (0-7) that transmit data to QLM1 and QLM2. Tx-lanes 0-3 transmit data to QLM1 lanes 0-3, while Tx-lanes 4-7 transmit data to QLM2 lanes 0-3. The Tx-lane is configured to implement a majority of the Interlaken framing-layer definition. This includes the metaframe CRC32 calculation, data inversion and scrambling and lane diagnostics.

The first stage of each Tx-lane 302 performs a CRC32 calculation. It is calculated over all the Interlaken words within the metaframe, except for the 64-bit/67-bit framing bits. The diagnostic words are updated with the result of the calculation. The second stage performs data inversion and scrambling as per the Interlaken protocol definition. The final stage of the Tx-lane transforms a continuous stream of 67-bit words into a continuous stream of 10-bit words. These 10-bit words are provided to the appropriate lane of the appropriate QLM.

Figure 4:
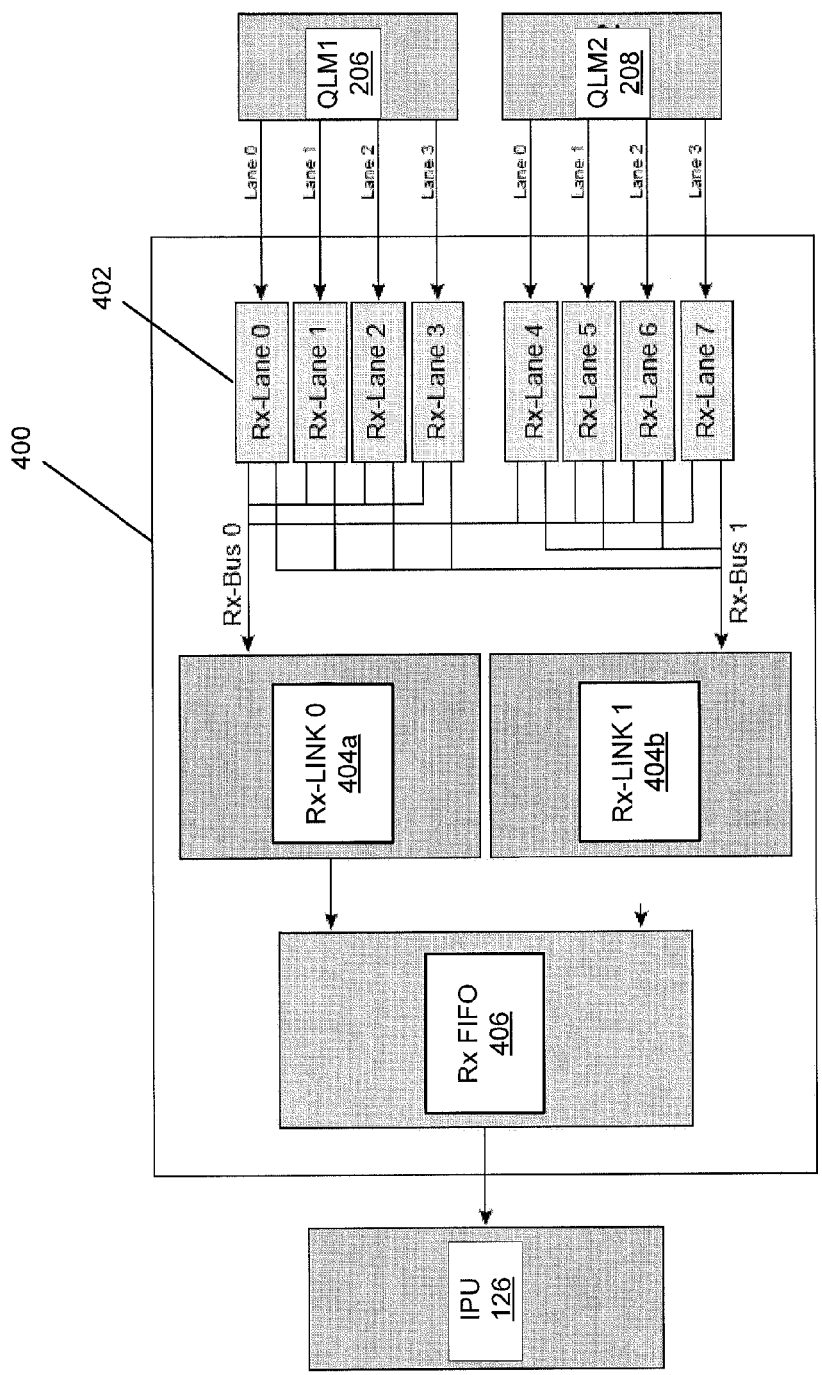
FIG. 4 illustrates an example receiver in the interface unit of FIG. 2.

FIG. 4 is a block diagram of an example receiver 400 of the interface unit of FIG. 2. The receiver 400 includes per-lane logic (Rx-lane) 402 and per-link logic (Rx-link) 404. This allows the ILK interface unit to either bundle eight Rx-lanes to a single Rx-link (1×8) or split the lanes between two Rx-links (e.g. 2×4 or 1×4 and 1×2, etc.). The receiver also includes a FIFO 406 that stores the received data until it can be delivered to the packet input processing unit 126.

There are eight Rx-lanes (0-7) that receive data from QLM1 and QLM2. Rx-lanes 0-3 receive data from QLM1 lanes 0-3 respectively, while Rx-lanes 4-7 receive data from QLM2 lanes 0-3 respectively.

Figure 5:
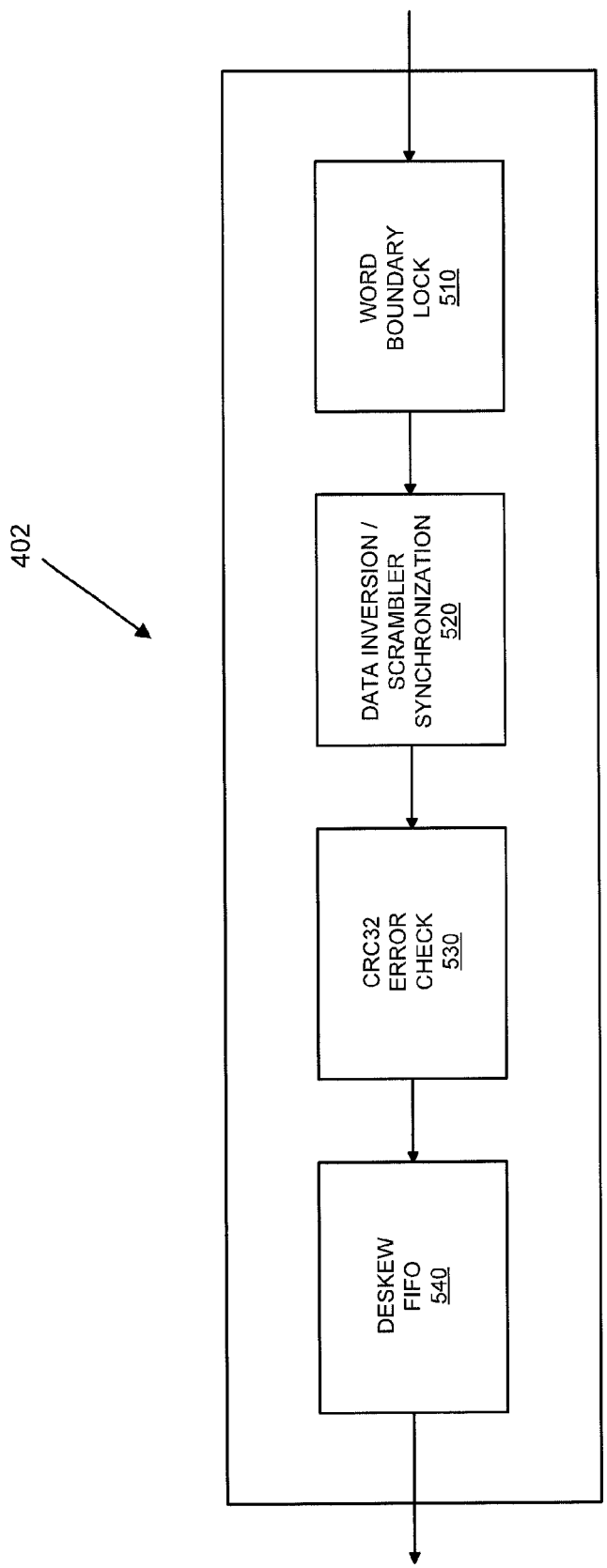
FIG. 5 is a block diagram of an example receiver lane of the receiver of FIG. 4.

FIG. 5 illustrates an example receiver lane 402 of the receiver of FIG. 4. The Rx-lane implements a majority of the Interlaken framing-layer definition. This includes the 64-bit/67-bit word-boundary lock, scrambler synchronization, data inversion and descrambling, metaframe CRC32 checks, skip-word removal and lane diagnostics.

The first stage 510 of each Rx-lane is the 64-bit/67-bit word-boundary lock. Prior to the lock being enabled, all receive data is ignored. Once the lock is enabled by software, receive data is searched for the 2-bit pattern that delineates 67-bit words as per the Interlaken protocol definition. Once word-boundary lock is achieved, 67-bit words are passed on to the next stage. Note that software may enable only the word-boundary lock on an Rx-lane that has been enabled by an Rx-link.

The second stage 520 performs data inversion and scrambler-stage synchronization as per the Interlaken protocol definition. This process is used to delineate a stream of 67-bit Interlaken words into a metaframe.

Data inversion addresses the problem of baseline wander, or DC imbalance, which may be caused by an accumulated excess of 1's or 0's transmitted on an individual SerDes lane. To account for this effect, the Interlaken protocol definition inverts the sense of the bits in each transmitted word such that the running disparity is bounded. For each lane of a bundle, a running count of the disparity is maintained: a '1' bit increments the disparity by one, and a '0' bit decrements the disparity by one. Before transmission, disparity of the current word is calculated and then compared to the current running disparity. If the current word and the existing disparity both have the same sign, then bits [63:0] within the word are inverted. A framing bit is supplied in bit position 66 so the receiver may identify whether the bits for that word are inverted. The data inversion in the second stage 520 processes the framing bit in bit position 66 accordingly and un-inverts bits [63:0] if bit position 66 indicates a data inversion.

Once scrambler-stage synchronization is achieved, the payload of received metaframes is descrambled and passed on to the next stage.

The third stage 530 performs a CRC32 check. It is calculated over all the Interlaken words within the metaframe, except for the 64-bit/67-bit framing bits. CRC32 errors are recorded for diagnostic purposes, allowing software to determine which lane is the source of interface errors.

The final stage 540 of each Rx-lane is a deskew FIFO for processed Interlaken words. The Rx-link bundles the lanes by controlling the unloading of the deskew FIFO.

Figure 6:
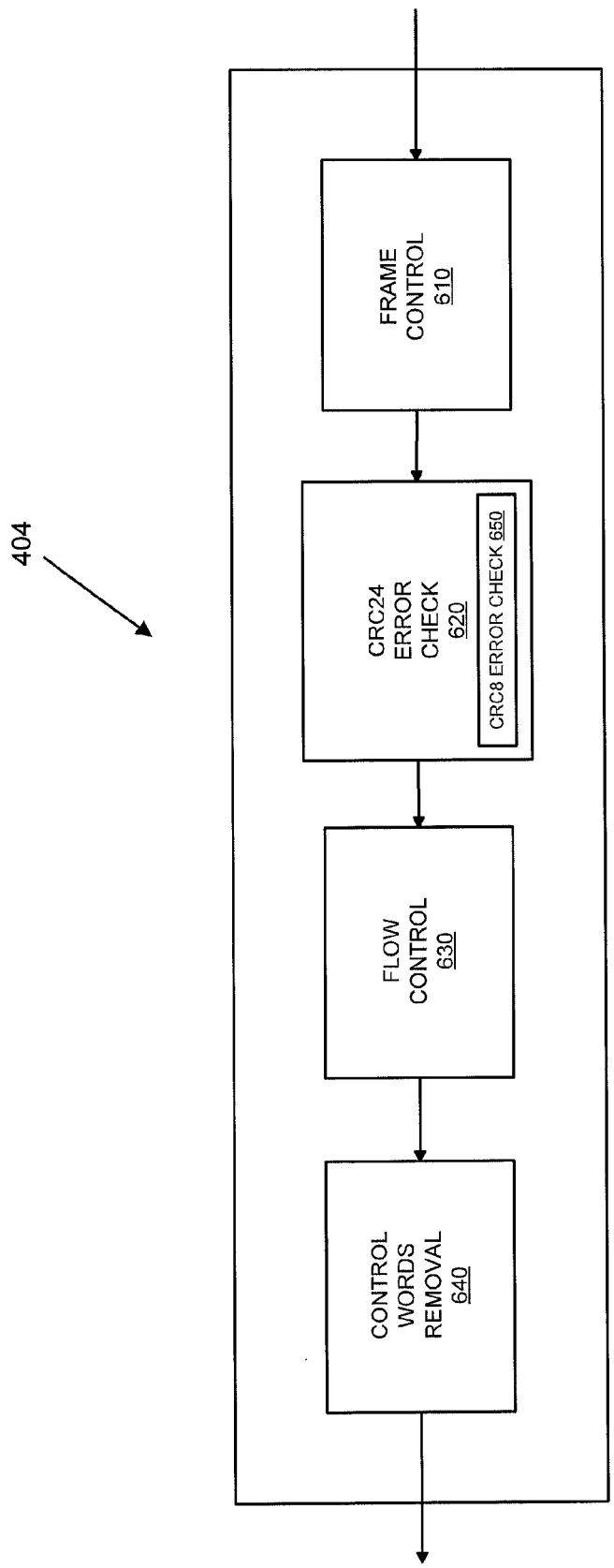
FIG. 6 is a block diagram of an example receiver link of the receiver of FIG. 4.

FIG. 6 illustrates an example receiver link 404 of the receiver of FIG. 4. There are two Rx-links connected to a bundle of Rx-lanes. Software uses lane-enable to select the Rx-lanes assigned to a given Rx-link.

The Rx-link implements part of the Interlaken framing layer, namely lane alignment. The Rx-link also implements the Interlaken protocol-layer definition, which includes destriping, CRC24 checks, burst control, tracking open channels and flow control.

The first stage 610 of the Rx-link is the frame control, which performs lane alignment and destriping in the following manner. When all enabled lanes for a given Rx-link have reached scrambler-state synchronization, software can then enable lane alignment. Prior to the lane alignment being enabled, data is drained from all enabled lanes without inspection. Once lane alignment is enabled, the Rx-link aligns the synchronization words to the front of each deskew FIFO by selectively unloading the deskew FIFO of enabled lanes. Then, once the lanes are aligned, the incoming Interlaken words are destriped by unloading one word from each lane in succession. These Interlaken words are passed on to the second stage.

The second stage 620 of the Rx-link is a CRC24 error check. The CRC24 error check covers the previous data burst (if any) and the control word containing the received CRC24. A CRC24 error causes all open packets to be forced closed with an error.

The third stage 630 of the Rx-link processes the flow-control information received in the burst/idle control words. The received flow-control status bits are mapped to ports/channels of the packet input processing unit 126. Each control word contains 16 bits located in bit positions [55:40]. Each flow-control status bit communicates XON or XOFF. By convention, XON is represented by 1 and indicates permission for transmission. XOFF is represented by 0 and indicates data should not be transmitted.

The final stage 640 removes the burst/idle control words and pushes packet data to the shared Rx FIFO 406 (FIG. 4). If the Rx FIFO is full and the packet start-of-packet (SOP) has already been pushed, the packet is truncated and marked with a truncation error. If the Rx FIFO is full and the packet SOP has not been pushed, the entire packet is dropped and a statistic counter is incremented. Pushing the packet SOP marks the channel as open. If the channel was already open, an end-of-packet (EOP) with error is pushed prior to the new SOP.

Having described the elements of the receiver 400, an embodiment is now described which achieves improved error correction for received data bursts.

Figure 7:
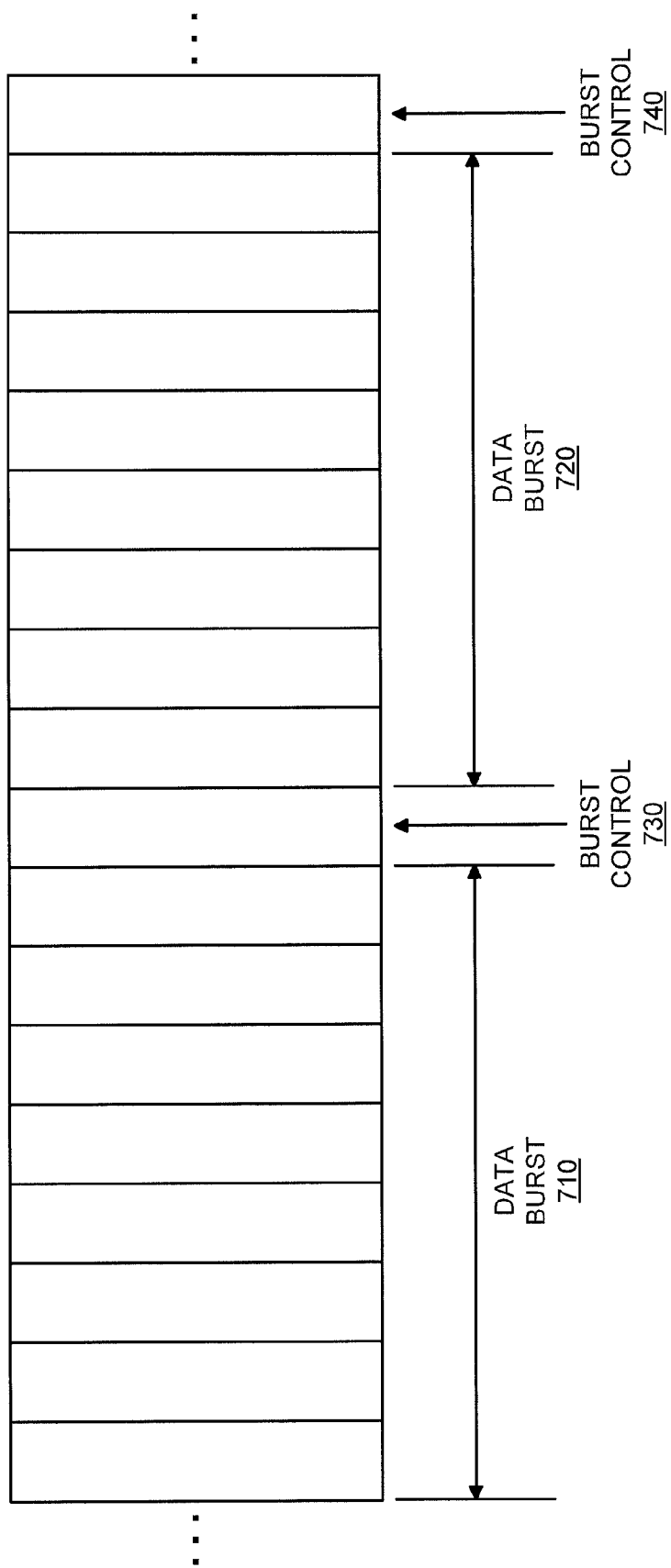
FIG. 7 is a block diagram of a data burst sequence.

The block diagram of FIG. 7 shows a portion of a sequence of data bursts 710, 720 in an incoming data stream. Each burst is bounded by two burst control words, one before the burst and one after the burst. For example, burst control words 730, 740 are shown before and after, respectively, the data burst 720. Each burst control word simultaneously marks the end of the current burst and the start of the next burst. For example, burst control word 730 marks the end of data burst 710 and the start of data burst 720. A typical burst is 256 B, while the burst control word is 8 B. In this example, each data burst 710, 720 includes eight 8-byte data words.

Fields within the burst control word affect either the data following or preceding the burst control word, including functions such as start-of-packet (SOP), end-of-packet (EOP), logical communication channel and error detection, as noted above for the Interlaken Protocol. The SOP and channel fields apply to the next burst. The EOP and CRC24 error check apply to the previous burst. In addition, the CRC24 error check includes the burst control word itself. Consequently, a bad CRC24 checksum indicates the burst control word fields such as channel, SOP and EOP are all suspect. Thus, a receiver with a bad CRC24 checksum errors out all open channels and does not allow the SOP field to open a channel A channel is considered open if the SOP for a packet has been received, but the EOP has not yet been received. In the Interlaken Protocol, 256 logical communication channels are supported.

The probability of an error in the data portion of the data burst is significantly higher than the probability of error in the burst control word itself. In the approach of the present invention, the burst control word is augmented to include an additional CRC function to protect the burst control word itself. With this inventive approach, the impact of bit errors in the incoming data stream can be reduced.

In the Interlaken Protocol, the multiple-use field is recommended to carry either extra in-band flow control or extra channel bits. Otherwise, this field goes unused. In an embodiment, the burst control word format is modified by inserting a CRC8 error check in bit positions [31:24] of the multiple-use field. The burst control word format becomes as shown in the following table:

| Field | Bit Position |
| --- | --- |
| Inversion | 66 |
| Framing | 65:64 |
| Control | 63 |
| Type | 62 |
| SOP | 61 |
| EOP | 60:57 |
| Reset Calendar | 56 |
| In-Band Flow Control | 55:40 |
| Channel Number | 39:32 |
| CRC8 | 31:24 |
| CRC24 | 23:0 |

Figure 8:
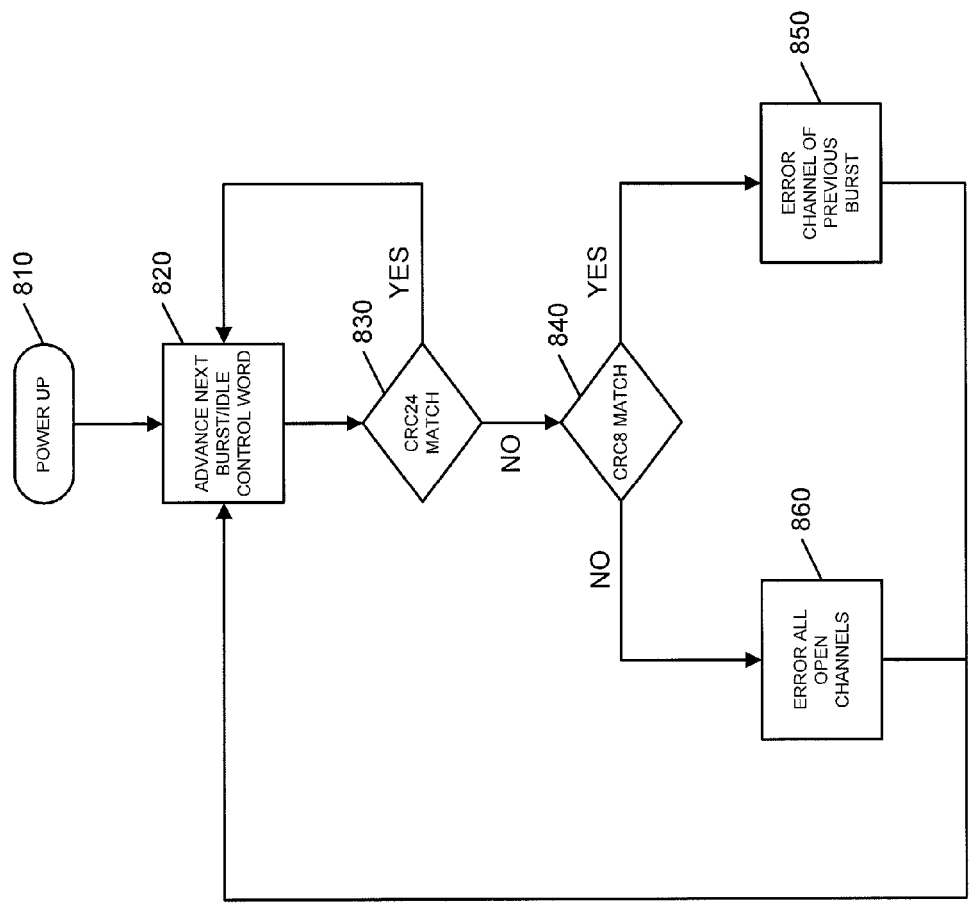
FIG. 8 is a flow diagram of an error checking operation.

Referring to FIG. 6, the second stage of receiver link 404, which includes CRC24 error check 620, is augmented to include CRC8 error check 650. Operation of the second stage of the receiver link with both CRC24 and CRC8 error detection is now described in connection with the flow diagram of FIG. 8.

Starting from power up or reset state 810, the receiver link 404 at 820 operates on the next burst/idle control word in the incoming data stream. If the receiver link 404 detects the CRC24 checksum is a match at 830, it can be inferred that the CRC8 checksum is correct. This is because the multi-use field would continue to be part of the CRC24 checksum. Thus, the processing of the data stream continues and the operation of the second stage of the receiver link 404 advances to the next burst/idle control word again at 820.

If the receiver link 404 detects a CRC24 checksum error at 830, the CRC8 checksum is used at 840 to determine if the control word is error free. In the event that the CRC8 checksum is correct, only the channel corresponding to the previous burst is errored out at 850. If the CRC24 checksum is incorrect at 830 and the CRC8 checksum is also incorrect at 840, the receiver link 404 errors out all open channels and does not allow the SOP to open a channel at 860.

Each burst could open another channel without closing the previous channel. In this manner, many channels could all be open simultaneously. A good CRC8 will isolate the failure to a single packet on a single channel Without a CRC8 check or for a failing CRC8 check, many packets on many channels will receive an error.

In the example of FIG. 7, the first data burst 710 and second burst 720 could both be for the same packet. A bad CRC24 checksum and a good CRC8 checksum affect both the first and second burst. However, the effect would still be limited to a single packet on a single channel.

While embodiments of the invention have been described in the context of Interlaken Protocol, it should be understood that the principles of the invention may be applied to any other data transmission configurations in which a checksum protects both data and control, including but not limited to SPI4.2. It should also be understood that other error checking functions are contemplated besides CRC8, including but not limited to SECDED and the following 9 bit polynomials:

$x8+x2+x+1$ $x8+x5+x4+1$ $x8+x7+x6+x4+x2+1$ $x8+x4+x3+x2+1$ $x8+x7+x4+x3+x+1$

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A method comprising:
   receiving at a data interface a data stream having a plurality of logical communication channels, the data stream including in succession a first data burst corresponding to one of the plurality of logical communication channels, a burst control word and a second data burst corresponding to the one or an other of the plurality of logical communication channels, the burst control word including a first error check that protects the first data burst and the burst control word and a second error check that protects only the burst control word;
   examining the first error check and the second error check;
   erroring out only the one logical communication channel if the first error check is bad and the second error check is good;
   erroring out all open logical communication channels if the first error check is bad and the second error check is bad.

2. The method of claim 1 wherein the first error check is CRC24 and the second error check is CRC8.

3. The method of claim 1 wherein the data interface comprises an Interlaken Protocol-based interface.

4. A receiver comprising:
   a data interface configured to receive a data stream having a plurality of logical communication channels, the data stream including in succession a first data burst corresponding to one of the plurality of logical communication channels, a burst control word and a second data burst corresponding to the one or an other of the plurality of logical communication channels, the burst control word including a first error check that protects the first data burst and the burst control word and a second error check that protects only the burst control word; and
   an error detection circuit configured to examine the first error check and the second error check; error out only the one logical communication channel if the first error check is bad and the second error check is good; and error out all open logical communication channels if the first error check is bad and the second error check is bad.

5. The receiver of claim 4 wherein the first error check is CRC24 and the second error check is CRC8.

6. The receiver of claim 4 wherein the data interface comprises an Interlaken Protocol-based interface.

* * * * *